United States Patent
Park

(10) Patent No.: US 7,161,837 B2
(45) Date of Patent: Jan. 9, 2007

(54) ROW DECODER CIRCUIT OF NAND FLASH MEMORY AND METHOD OF SUPPLYING AN OPERATING VOLTAGE USING THE SAME

(75) Inventor: Se Cheon Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 17 days.

(21) Appl. No.: 11/158,346

(22) Filed: Jun. 22, 2005

(65) Prior Publication Data

US 2006/0077716 A1   Apr. 13, 2006

(30) Foreign Application Priority Data

Oct. 7, 2004 (KR) ...................... 10-2004-0079902

(51) Int. Cl.
*G11C 16/06* (2006.01)
(52) U.S. Cl. ............................ 365/185.23; 365/185.11; 365/185.17
(58) Field of Classification Search ........... 365/185.17, 365/185.11, 185.23, 185.05, 185.08, 230.03, 365/230.06

See application file for complete search history.

(56) References Cited

U.S. PATENT DOCUMENTS

| 6,236,594 B1 * | 5/2001 | Kwon | 365/185.11 |
| 6,594,178 B1 * | 7/2003 | Choi et al. | 365/185.17 |
| 6,731,540 B1 * | 5/2004 | Lee et al. | 365/185.17 |

* cited by examiner

*Primary Examiner*—Gene N. Auduong
(74) *Attorney, Agent, or Firm*—Mayer Brown Rowe & Maw LLP

(57) ABSTRACT

A row decoder circuit of a NAND flash memory and method of supplying an operating voltage using the same. To prevent an operating voltage (e.g., a program voltage, a pass voltage, or a read voltage) from being abnormally transferred to a gate of a memory cell because a pumping voltage is applied to a gate of a high-voltage pass transistor of the row decoder circuit in a level lower than a target voltage, the pumping voltage is first applied to the gate of the high-voltage pass transistor (i.e., precharging the gate of the high-voltage pass transistor) and next the operating voltage is applied to a drain of the high voltage pass transistor. Thus, the pumping voltage becomes higher than the target voltage due to a self-boosting effect through the structure of transistor, enabling the operating voltage to be normally transferred to the gate of the memory cell.

5 Claims, 5 Drawing Sheets

ROW DECODER CIRCUIT OF NAND FLASH MEMORY AND METHOD OF SUPPLYING AN OPERATING VOLTAGE USING THE SAME

BACKGROUND

1. Field of the Invention

The present invention relates to a row decoder circuit of a NAND flash memory device and method of supplying an operating voltage using the same. More specifically, the present invention relates to a row decoder circuit of a NAND flash memory device and method of normally supplying an operating voltage using the same to a wordline or a selected line during a low power operation.

2. Discussion of Related Art

A NAND flash memory device is a type of storage apparatus that is electrically erasable and programmable, retaining its data even without a power supply. Such a NAND flash memory device is configured according to the following structure.

FIG. 1 is a block diagram showing a general NAND flash memory device.

As illustrated in FIG. 1, the NAND flash memory device includes a memory cell array 110, a row selection circuit 120, and a page buffer circuit 130.

The memory cell array 110 includes pluralities of strings 111 coupled to bitlines BL0~BLm respectively. The string 111 on each column (or bitline) is composed of a drain selection transistor DST, a source selection transistor SST, and pluralities of flash memory cells MCn (n=0~15; shown with 16 in number as an example) serially connected between the selection transistors DST and SST. The drain selection transistor DST on each column has a drain connected to the bitline and a gate coupled to a drain selection line DSL. The source selection transistor SST has a source connected to a common source line CSL and a gate coupled to a source selection line SSL. Between a source of the drain selection transistor DST and a drain of the source selection transistor SST, the flash memory cells M15~MC0 are connected in series. The flash memory cells MC15~MC0 are each coupled to wordlines WL15~WL0.

Meanwhile, the drain selection line DSL, the wordlines WL0~WL15, and the source selection line SSL are electrically connected to the row selection circuit. The row selection circuit 120 selects one of the wordlines in response to address information, and supplies wordline voltages to selected and deselected wordlines in accordance with each operation mode, which will be described later in detail.

The bitlines BL0~BLm arranged on the memory cell array 110 are each connected to pluralities of page buffers included in the page buffer circuit 130. The page buffer circuit 130 senses data from the flash memory cells coupled to selected wordlines in a read mode through the bitlines BL0~BLm, and supplies a power source voltage or a ground voltage to the bitlines BL0~BLm in correspondence with data to be programmed.

The row selection circuit 120 supplies a program voltage (e.g., 18V) to a selected wordline, during a program mode, while supplying a pass voltage (e.g., 10V) to deselected wordlines. The row selection circuit 120 supplies the ground voltage to a selected wordline, during a read mode, while supplying a read voltage (e.g., 4.5V) to deselected wordlines. The program voltage, the pass voltage, and the read voltage are voltages (e.g., 3V) higher than the power source voltage.

In order to supply a high voltage over the power source voltage to the wordline in response to the address information, the row selection circuit 120 is required to include a circuit capable of switching the high voltage. Such a high-voltage switching circuit may be implemented by means of a switch pumping or boosting scheme.

FIG. 2 is a circuit diagram illustrating the row selection circuit shown in FIG. 1.

Referring to FIG. 2, the row selection circuit 120 includes a decoding block 121, a switch pumping block 122, and a switching block 123.

The decoding block 121 may be constructed of NAND gates G1 and G2. Address signals DA1~DAi are applied to the first NAND gate G1, while a control signal BLKWLdis and an output signal of the first NAND gate G1 are applied to the second NAND gate G2. The control signal BLKWLdis is held at a high level while prosecuting erasing, programming, and reading operations.

The switch pumping block 122 is connected to a block wordline node BLKWL, and is constructed of a third NAND gate 63, a capacitor C1, and first through fourth NMOS transistors MN1~MN4, as illustrated in FIG. 2.

The switching block 123 is composed of pass (or transfer) transistors, NDSL, N15~N0, and NSSL, which transfer selection signals, GDSL, GWL15~GWL0, and GSSL, to their corresponding signal lines DSL, WL15~WL0, and SSL. The pass transistors, NDSL, N15~N0, and NSSL, are coupled to the block wordline node BLKWL through their gates.

The decoding block 121 and the switch pumping block 122 construct a block decoder to select a memory block.

When at least one of the address signals DA1~DAi is low level, an output signal of the decoding block 121 goes to low level. During this, the switch pumping block 123 does not prosecute a pumping operation of a clock signal CLK. Otherwise, when the address signals DA1~DAi are all at a high level, the output signal of the decoding block 121 goes to a high level. The switch pumping block 122 operates in response to the low-to-high and the high-to-low transitions of the clock signal CLK. Here, the low level is the ground voltage level and the high level is the power source voltage level. The capacitor C1 repeats charging/discharging operations in accordance with the transitions of the clock signal CLK. If the capacitor C1 is charged up with pumped charges by the high-to-low transitions of the clock signal CLK, the pumped charges are transferred through the first NMOS transistor MN1 to increase a voltage of the block wordline node BLKWL.

If the clock signal CLK transitions to high level from low level, a VPP voltage (a read voltage Vread in a reading operation, a program voltage Vpgm in a programming operation; hereinafter, referred to as 'operating voltage') is supplied to a gate of the second NMOS transistor MN2. The second NMOS transistor MN2 is conditioned into a shut-off state by a voltage difference between the gate and source after some time.

If the capacitor C1 is charged up again by the high-to-low transition of the clock signal CLK, pumped charges are transferred through the first NMOS transistor MN1 to increase the voltage of the block wordline node BLKWL. Thereafter, if the clock signal CLK transitions to high level from low level, the operating voltage is applied to a gate of the first NMOS transistor MN1 through the second NMOS transistor MN2. By the repetition of this operation, the voltage of the block wordline node BLKWL gradually increases to reach VPP0+Vtn3 finally. Here, Vtn3 is a threshold voltage of the third NMOS transistor MN3. The third NMOS transistor MN3 clamps the voltage of the block wordline node BLKWL that may increase over a required voltage level.

By way of the operation described above, the block wordline node BLKWL has a voltage level that is high enough to transfer the program voltage Vpgm or the read voltage Vread to a corresponding wordline.

However, the structure of the switch pumping block shown in FIG. 2 is inadequate for a low-power NAND flash memory device in the following reason.

While performing the pumping operation, the threshold voltage of the first and second NMOS transistors MN1 and MN2 are raised by body effects. As a result, the voltage level of the block wordline node BLKWL is limited to increasing due to the rising threshold voltages.

A problem of the conventional row selection circuit during a programming operation will be described with reference to waveforms at the nodes.

FIG. 3 is a waveform diagram illustrating potentials of nodes in the row selection circuit during a programming operation.

Referring to FIGS. 2 and 3, transfer of a Vcc voltage of GDSL, and Vpgm and Vpass of GWL0~GWL15 to the drain selection line DSL and the wordlines WL0~WL15 without voltage drops by Vth is only possible when the voltage of the block wordline node BLKWL is equal to or higher than Vpgm+Vth.

But, there is degradation of pumping efficiency due to the rising threshold voltage by body effects at the first and second NMOS transistors MN1 and MN2 used in the switch pumping block 122. Especially, in the condition of pumping under a low Vcc, the pumping efficiency is almost insignificant.

Therefore, in a pumping operation under the low Vcc, it is impossible to transfer the program voltage, as well as the pass voltage, because the voltage of the block wordline node BLKWL does not rise up to Vpgm+Vth.

SUMMARY OF THE INVENTION

The present invention is directed to solving the above problem by providing a row decoder circuit of a NAND flash memory and a method of supplying an operating voltage using the same, in order to prevent an operating voltage (e.g., a program voltage, a pass voltage, or a read voltage) from being abnormally transferred to a gate of a memory cell because a pumping voltage is applied to a gate of a high-voltage pass transistor of the row decoder circuit in a level lower than a target voltage, the pumping voltage is first applied to the gate of the high-voltage pass transistor (i.e., precharging the gate of the high-voltage pass transistor) and next the operating voltage is applied to a drain of the high voltage pass transistor, by which the pumping voltage becomes higher than the target voltage due to a self-boosting effect through the structure of the transistor, enabling the operating voltage to be normally transferred to the gate of the memory cell.

A row decoder circuit of a NAND flash memory device, in accordance with an embodiment of the present invention, comprises a block decoder selecting a specific one of memory blocks included in a main memory array, a first switching block including pass transistors to transfer operating voltages to the memory block in response to an output signal of the block decoder, and a second switching block transferring the operating voltages to drains of the pass transistors after sensing a supply of the output signal to gates of the pass transistors. The output signal is applied to the pass transistors earlier than the operating voltages so as to normally transfer the operating voltages.

In this embodiment, the block decoder includes a decoding block generating a selection signal when a corresponding block is designated by an address signal, and a switch pumping block generating the output signal by way of pumping the selection signal.

In this embodiment, the switch pumping block comprises a NAND gate receiving the selection signal of the decoding block and a clock signal, a capacitor connected between an output terminal of the NAND gate and a first node, a first NMOS transistor connected between the first node and the output terminal, having a gate coupled to the first node, a second NMOS transistor connected between the first node and a power source voltage terminal to which the operating voltage is applied, having a gate coupled to the output terminal, and a third NMOS transistor connected between the power source voltage terminal and the output terminal, having a gate coupled to the output terminal.

A method of supplying an operating voltage in a NAND flash memory device, according to an embodiment of the present invention, comprises the steps of selecting one among a plurality of memory blocks, applying a predetermined voltage to gates of pass transistors each connected to selection lines and wordlines of the memory block included in a row decoder, and applying operating voltages, which will be supplied to the selection lines and wordlines of the memory block, to drains of the pass transistors, after applying the predetermined voltage to the gates of the pass transistors, so as to increase the predetermined voltage higher by self-boosting effects of the pass transistors. Thereby, the operating voltages are normally transferred to the selection lines and wordlines of the memory block through the pass transistors by the increased voltage.

BRIEF DESCRIPTION OF THE DRAWINGS

The accompanying drawings are included to provide a further understanding of the invention, and are incorporated in and constitute a part of this specification. The drawings illustrate examplary embodiments of the present invention and, together with the description, serve to explain principles of the present invention. In the drawings.

DETAILED DESCRIPTION OF PREFERRED EMBODIMENTS

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the dimensions of certain devices may be exaggerated for clarity. Like numerals refer to like elements throughout the specification.

FIG. 4 is a circuit diagram illustrating a row selection circuit (i.e., row decoder circuit) of a NAND flash memory device according to an embodiment of the present invention.

Figure 4:
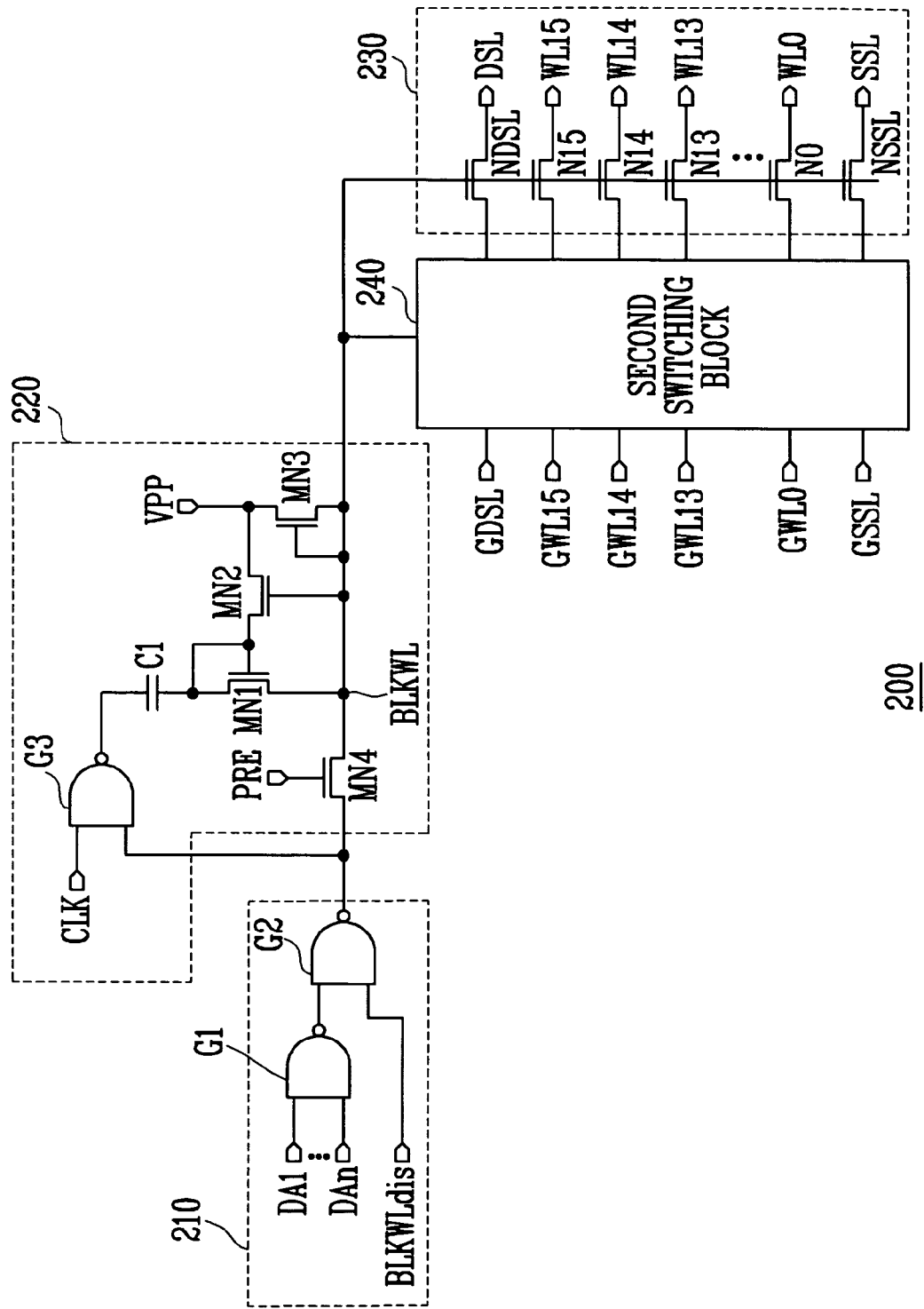
FIG. 4 is a circuit diagram illustrating a row selection circuit of a NAND flash memory device according to an embodiment of the present invention.

Referring to FIG. 4, the row selection circuit 200 is comprised of a decoding block 210, a switch pumping block 220, and first and second switching blocks 230 and 240. The decoding block 210 and the switch pumping block 220 form a block decoder to select memory blocks, being able to be provided with a plurality of memory blocks.

In the configurations, the circuit structures and operations of the decoding block 210, the switch pumping block 220, and the first switch pumping block 230 are substantially identical to those of the conventional circuits, so it will not be described herein.

Figure 1:
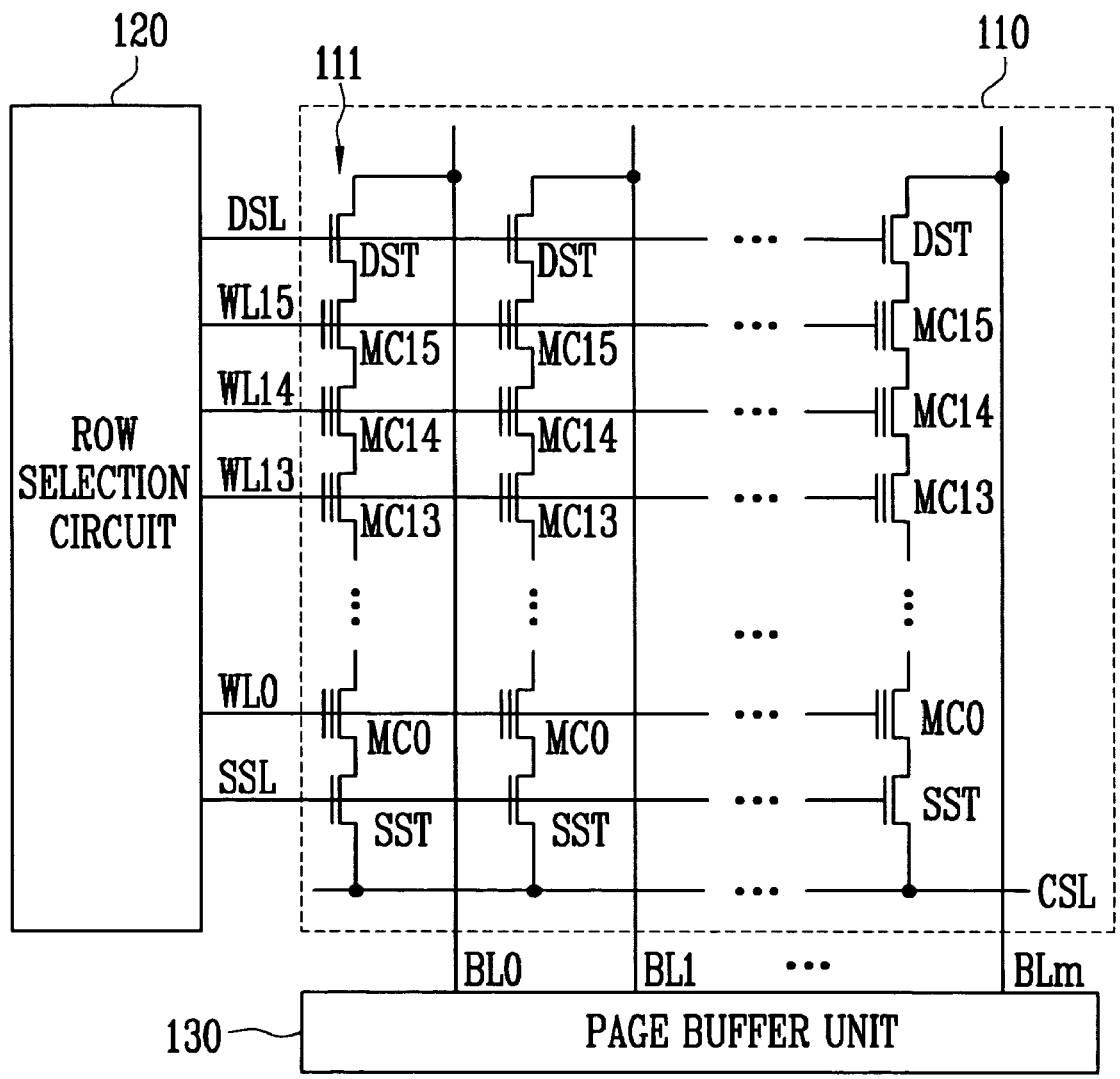
FIG. 1 is a block diagram showing a general NAND flash memory device.
Figure 2:
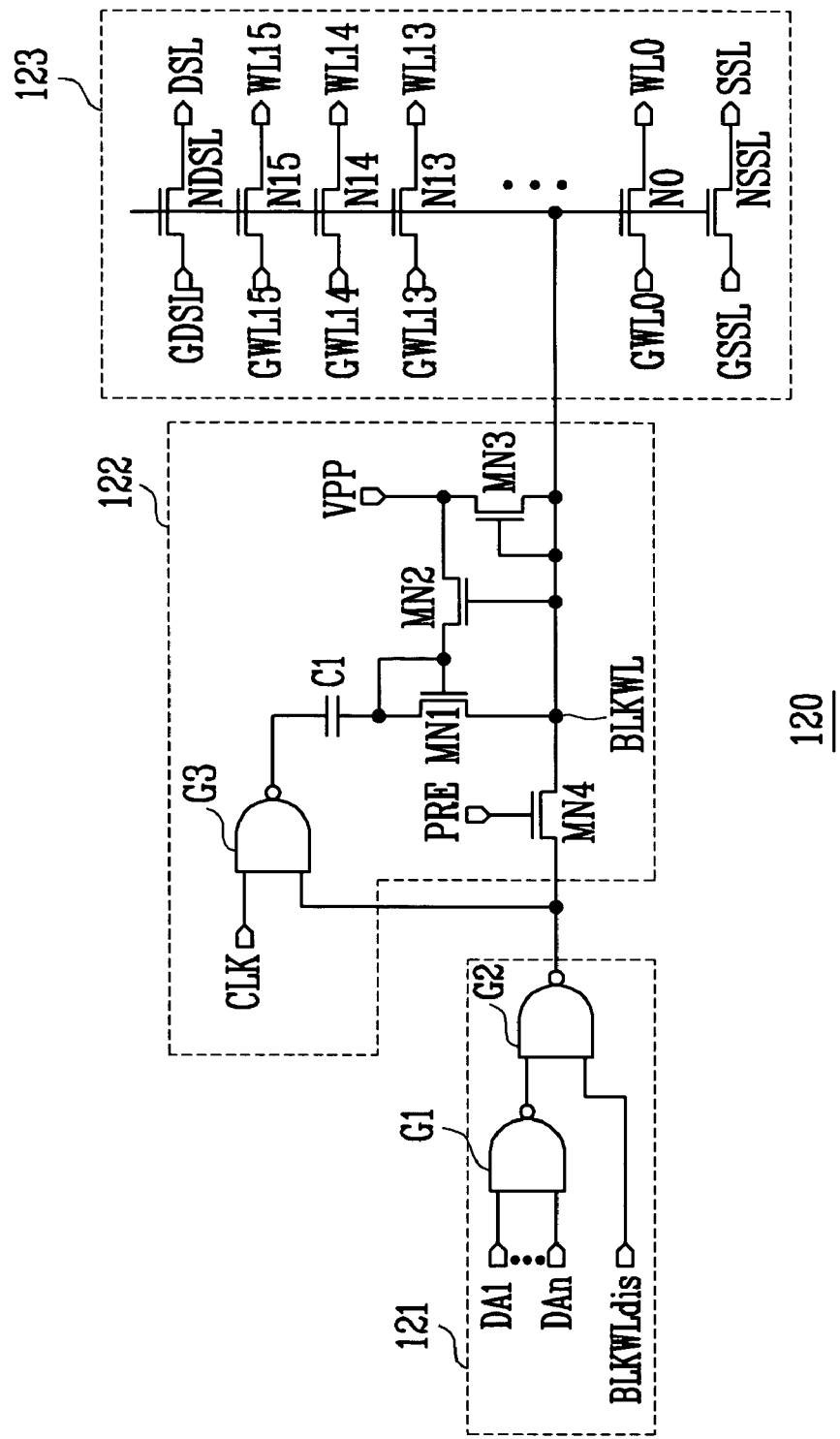
FIG. 2 is a circuit diagram illustrating a row selection circuit shown in FIG. 1.
Figure 3:
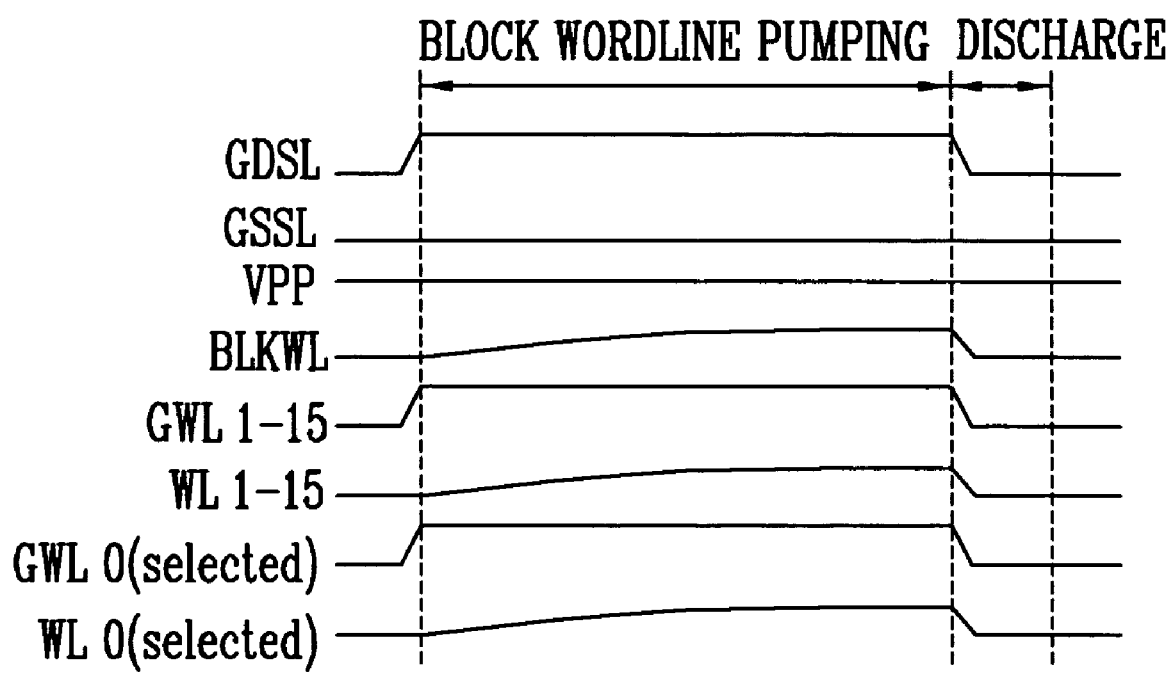
FIG. 3 is a waveform diagram illustrating potentials of nodes in the row selection circuit during a programming operation.

It is for the feature in the row selection circuit 200 that the second switching block 240 is included therein. The second switching block 240 senses an electric potential at the block wordline node BLKWL of the switch pumping block 220, which is a voltage applied to gates of the pass transistors NDSL, N15~N0, and NSSL constructing the first switching block 230. And, dependent on the electric potential of the block wordline node BLKWL, the second switching block 240 controls an operating voltage (e.g., a program voltage, a read voltage, or a pass voltage), which will be supplied to the selection line (DSL or SSL in FIG. 1) or the wordlines WL0~WL15, being applied to the first switching block 230.

The row selection circuit of the NAND flash memory device according to the preferred embodiment of the present invention in conjunction with FIG. 5 in more detail will now be described.

Figure 5:
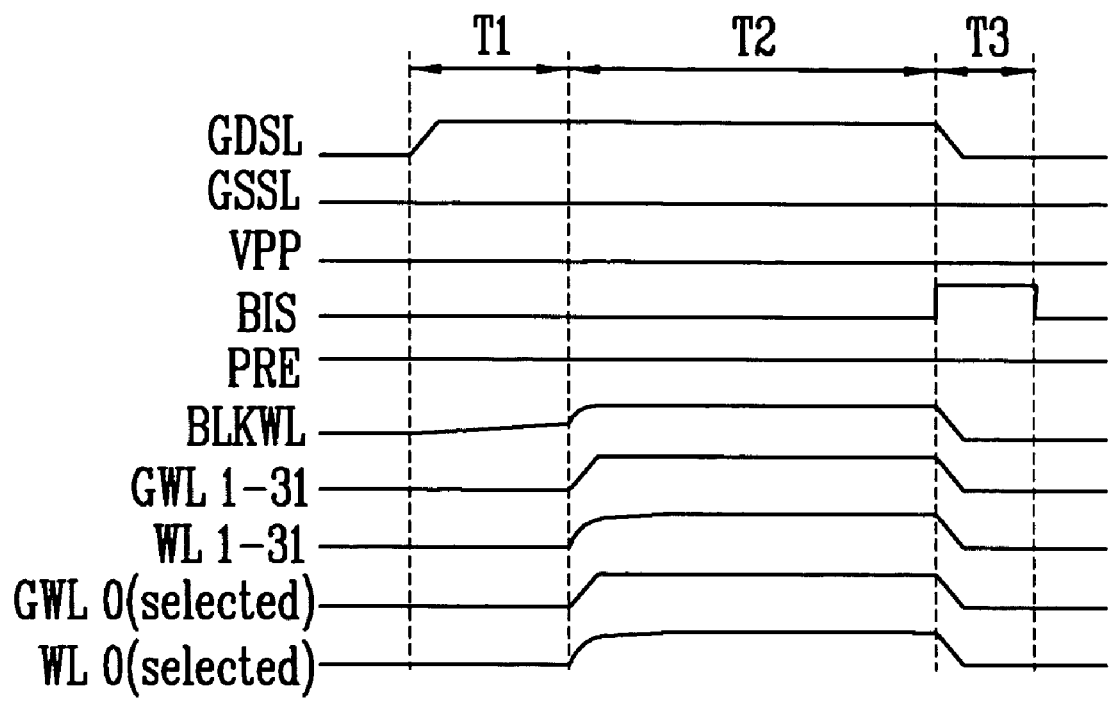
FIG. 5 is a waveform diagram illustrating potentials of nodes in the row selection circuit shown in FIG. 4 during a programming operation.

FIG. 5 is a waveform diagram illustrating potentials of nodes in the row selection circuit shown in FIG. 4 during a programming operation.

Referring to FIGS. 4 and 5, in a BLKWL precharging period t1, if the decoding block 210 outputs a signal of high level when the address signals DA1~DAi all become high level, the switch pumping block 220 operates in response to low-to-high and high-to-low transitions of the clock signal CLK. In other words, through the repetition of charging and discharging operations of the capacitor C1 in response to the clock signal CLK, pumped charges are transferred by way of the first NMOS transistor MN1 to increase the voltage of the block wordline node BLKWL. Through this operation, the block wordline node BLKWL coupled to gates of the pass transistors NDSL, N15~N0, and NSSL is precharged.

However, as aforementioned, as the threshold voltage of the first and second NMOS transistors MN1 and MN2 are raised by body effects, the voltage level of the block wordline node BLKWL is limited to increasing due to the rising threshold voltages.

In a block wordline node pumping period t2, if the second switching block 240 detects the voltage of the block wordline node BLKWL as being precharged, it transfers the operating voltage (e.g., the program voltage, the pass voltage, or the read voltage) to drains of the pass transistors NDSL, N15~N0, and NSSL.

Then, it causes self-boosting effects by the structures of the pass transistors NDSL, N15~N0, and NSSL, further increasing the voltage of the block wordline node BLKWL. In other words, the voltage of the block wordline node BLKWL becomes higher than a voltage (e.g., a sum of the operating voltage plus the threshold voltage) required to transfer the operating voltage. As illustrated in FIG. 5, it can be seen that the block wordline node BLKWL rises further than before by applying the operating voltage Vpgm or Vpass after precharging the block wordline node BLKWL.

Thus, sufficient voltages are applied to gates of the pass transistors NDSL, N15~N0, and NSSL, so that the operating voltages are each transferred to the drain selection line DSL, the wordlines WL0~WL15, and the source selection line SSL in normal conditions.

In a discharging period t3, in response to the control signal BLKdis for discharging, the switch pumping block 220 stops operating and thereby the block wordline node BLKWL is discharged.

As such, the operating voltage is safely transferred to the pass transistors by applying the operating voltage to the drains of the pass transistors NDSL, N15~N0, and NSSL after first precharging the block wordline node BLKWL coupled to the gates of the pass transistors NDSL, N15~N0, and NSSL.

As a result, as sufficient voltages are applied to the gates of the pass transistors NDSL, N15~N0, and NSSL, the operating voltages are each normally transferred to the drain selection line DSL, the wordlines WL0~WL15, and the source selection line SSL.

In the discharging period t3, in response to the control signal BLKdis for discharging, the switch pumping block 220 stops operating and thereby the block wordline node BLKWL is discharged.

On the other hand, in a reading operation, since it is available to conduct a low Vcc pumping operation, there is no problem as aforementioned. Therefore, it is also proper, even for the reading operation, to normally transfer the operating voltage.

As aforementioned, according to the present invention, in order to prevent an operating voltage (e.g., a program voltage, a pass voltage, or a read voltage) from being abnormally transferred to a gate of a memory cell because a pumping voltage is applied to a gate of a high-voltage pass transistor of the row decoder circuit in a level lower than a target voltage, the pumping voltage is first applied to the gate of the high-voltage pass transistor (i.e., precharging the gate of the high-voltage pass transistor) and next the operating voltage is applied to a drain of the high voltage pass transistor. Thus, the pumping voltage becomes higher than the target voltage due to a self-boosting effect through the structure of transistor, enabling the operating voltage to be normally transferred to the gate of the memory cell.

Although the present invention has been described in connection with the embodiments of the present invention illustrated in the accompanying drawings, it is not limited thereto. It will be apparent to those skilled in the art that various substitution, modifications and changes may be thereto without departing from the scope and spirit of the invention.

What is claimed is:

1. A row decoder circuit of a NAND flash memory device, the row decoder comprising:
    a block decoder selecting a specific one of a plurality of memory blocks included in a main memory array;
    a first switching block including pass transistors to transfer operating voltages to the memory block in response to an output signal of the block decoder; and
    a second switching block for transferring the operating voltages to drains of the pass transistors after sensing a supply of the output signal to gates of the pass transistors, wherein the output signal is applied to the pass transistors earlier than the operating voltages so as to normally transfer the operating voltages.

2. The row decoder circuit as set forth in claim 1, wherein the block decoder comprises:

a decoding block generating a selection signal when a corresponding block is designated by an address signal; and a switch pumping block generating the output signal by way of pumping the selection signal.

3. The row decoder circuit as set forth in claim 2, wherein the switch pumping block comprises:

a NAND gate receiving the selection signal of the decoding block and a clock signal;

a capacitor connected between an output terminal of the NAND gate and a first node;

a first NMOS transistor connected between the first node and the output terminal, having a gate coupled to the first node;

a second NMOS transistor connected between the first node and a power source voltage terminal to which the operating voltage is applied, having a gate coupled to the output terminal; and a third NMOS transistor connected between the power source voltage terminal and the output terminal, having a gate coupled to the output terminal.

4. A method of supplying an operating voltage in a NAND flash memory device, the method comprising:

selecting one of a plurality of memory blocks;

applying a predetermined voltage to gates of pass transistors each connected to selection lines and wordlines of the memory block included in a row decoder; and applying operating voltages, which will be supplied to the selection lines and wordlines of the memory block, to drains of the pass transistors, after applying the predetermined voltage to the gates of the pass transistors, so as to increase the predetermined voltage higher by self-boosting effects of the pass transistors, wherein the operating voltages are normally transferred to the selection lines and wordlines of the memory block through the pass transistors by the increased voltage.

5. The method as set forth in claim 4, wherein the selecting comprises:

generating a selection signal when a corresponding block is designated by an address signal; and generating the output signal by way of pumping the selection signal.

* * * * *